United States Patent [19]

Bhattacharyya et al.

[11] Patent Number: 5,874,778
[45] Date of Patent: Feb. 23, 1999

[54] EMBEDDED POWER AND GROUND PLANE STRUCTURE

[75] Inventors: Arup Bhattacharyya, Essex Junction; Robert K. Leidy, Burlington, both of Vt.

[73] Assignee: International Business Machines Corporation, Armonk, N.Y.

[21] Appl. No.: 873,102

[22] Filed: Jun. 11, 1997

[51] Int. Cl.$^6$ ........................................ H01L 23/48
[52] U.S. Cl. .................. 257/758; 257/759; 257/774; 257/776
[58] Field of Search .............................. 257/713, 797, 257/758, 759, 774, 776

[56] References Cited

U.S. PATENT DOCUMENTS

| | | |
|---|---|---|
| 5,000,818 | 3/1991 | Thomas et al. . |
| 5,003,273 | 3/1991 | Oppenberg . |
| 5,117,276 | 5/1992 | Thomas et al. . |
| 5,128,280 | 7/1992 | Matsumoto et al. . |
| 5,135,889 | 8/1992 | Allen . |
| 5,262,353 | 11/1993 | Sun et al. . |
| 5,287,619 | 2/1994 | Smith et al. . |
| 5,315,069 | 5/1994 | Gebara . |
| 5,406,118 | 4/1995 | Saito et al. ............................. 257/758 |
| 5,451,479 | 9/1995 | Ishibashi . |
| 5,472,900 | 12/1995 | Vu et al. . |
| 5,499,445 | 3/1996 | Boyle et al. . |
| 5,508,938 | 4/1996 | Wheeler . |
| 5,700,732 | 12/1997 | Jost et al. ............................. 257/797 |

FOREIGN PATENT DOCUMENTS 61-077326 4/1986 Japan .
7240368 9/1995 Japan .

OTHER PUBLICATIONS

"Chip Power Structure to Enhance Performance and Noise," IBM Technical Disclosure Bulletin, vol. 39, No. 9, p. 7, Sep. 1996.

"Planarity Layout Design for VLSI Chip Manufacturing," IBM Technical Disclosure Bulletin, vol. 37, No. 7, p. 457, Jul. 1994.

Intel. Paper, Symposium on VLSI Technology Digest of Technical Papers, p. 49, 1996.

Muraka, Steigerwald, and Gutmann, "Inlaid Copper Multi-level Interconnections Using Planarization by Chemical Mechanical," MRS Bulletin 1993.

"Edge Alignment and Edge Vernier Alignment Mark for Thin Film Head Fabrication," Kenneth Mason Publications Ltd. No. 308 Dec. 1989 Chen et al.

*Primary Examiner*—Peter Toby Brown
*Assistant Examiner*—Roy Potter
*Attorney, Agent, or Firm*—Ratner & Prestia; Eugene I. Shkurko

[57] ABSTRACT

A device architecture with embedded planar conductive ground and power planes in the device architecture. The apparatus includes a first conductive plane, a second conductive plane, a signal plane disposed between the first and second conductive planes, and a logic level disposed adjacent the first conductive plane and connected to the signal plane through at least one via in the conductive plane. The apparatus also includes a built-in alignment scheme. The invention includes a method for making the device and alignment architectures.

18 Claims, 5 Drawing Sheets

EMBEDDED POWER AND GROUND PLANE STRUCTURE

FIELD OF THE INVENTION

The present invention relates, in general, to a performance integrated circuit logic chip or a combined logic and memory chip and, more particularly, to a device and alignment architecture with embedded conductors.

BACKGROUND OF THE INVENTION

Many circuits are designed with transistors, especially in the microprocessor and computer industry. Historically, the dominant performance design characteristics associated with transistor circuits were transistor switching speed and current drive. Now, however, performance design characteristics of transistor circuits focus on clean signal transmission over long distances and thereby on capacitance and resistance of wiring levels because circuit density is increasing in the logic chip.

As the circuit density in a chip increases, circuit wiring lines become closer and closer over the semiconductor (e.g., silicon) substrate. This may increase the capacitance and resistance between signal lines. Thus, noise may increase. One noise source is, for example, the instability of the ground plane relative to the power plane caused by switching. Another noise source is the interference between two signals caused by the impedance of neighboring wires. In addition, an increase in capacitance and resistance may cause some signal lines to mirror other signal lines. As a result, the performance of the logic chip is driven more and more by the signal loss associated with noise sources. Historically, noise containment and power and ground plane stabilization had been achieved for multilevel ceramic substrates whereby semiconductor devices placed on the ceramic substrate communicate with one another via interconnections provided on the ceramic substrates. With increasing circuit density, however, functions of many discrete devices are being integrated into a single semiconductor (e.g., silicon) substrate requiring improvements to contain circuit noise within a highly integrated semiconductor device.

To stabilize the power plane and the ground plane from noise induced by switching, the power plane and ground plane may be placed across the plates of a capacitor. This is commonly done when using a semiconductor substrate by placing the substrate at ground and the n-well of a transistor at a voltage level. In addition, decoupling capacitors are increasingly being added to designs to further stabilize power planes. A decoupling capacitor on a silicon substrate is usually made of a thin oxide insulator with a polysilicon plate to maximize the amount of capacitance per unit area. These structures detract, however, from the overall density of the chip. In addition, these structures are prone to defects and cause pattern density problems in the process.

As shown in FIG. 1, in some logic designs metal contacts 30 (of tungsten, for example), metal contacts 32 (a tungsten stud, for example), and metal levels 34 and 40 and via 41 are used locally for wiring circuits. A basic transistor circuit C1 includes "p" regions 20, "n" regions 22, gates 28, an n-well 26, and isolation regions 24. The transistor circuit C1 shown in FIG. 1 is merely an exemplary circuit. Other circuits are feasible which incorporate the present invention, discussed below. Metal levels 30 and 34 locally connect transistors within a circuit. Metal level 40 and metal level 50 (shown in FIG. 2a) are used to transport signals from one circuit to the next with metal level 40 running perpendicular to metal level 50 to maximize wirability. Insulators 80, 82, 84, and 86 are used to ensure only appropriate contact is made between conductive elements.

Although it is known that electromagnetic signal lines could be shielded with the incorporation of a conductor plane, the prior art fails to disclose a scheme to incorporate this idea in a semiconductor substrate. Such a scheme is described in detail in the current invention

SUMMARY OF THE INVENTION

The present invention relates generally to the design and construction of semiconductor architecture and, more particularly, to embedding planar ground and power plane structures into the semiconductor architecture and substrate and providing a built-in alignment scheme. This invention should be distinguished and separated from existing prior art of embedding planar ground and power plane structures into ceramic substrates where materials, processes, parameters, and structures are entirely different.

The present invention discloses an apparatus with two conductive planes. A signal plane is disposed between the conductive planes and a logic level is disposed adjacent the first conductive plane and connected to the signal plane through at least one via in the conductive plane. The apparatus may be a semiconductor substrate. Also disclosed is a method of isolating device noise sources from a single plane in a device architecture. The method includes depositing a signal plane and at least two conductive planes, each separated from the signal plane by an isolation layer, and forming at least one via through the first conductive plane including connecting the signal plane and the device noise sources through at least one via.

One object of the present invention is to include planar ground and power planes which function similar to a coaxial cable. Thus, it is an object of the invention that a signal line cannot talk to a signal line below or above because a conductive barrier exists between the two signal lines. Another object of the invention is to provide a built-in decoupling capacitor. Yet another object of the invention is to provide integrated power and ground planes. The invention also provides interconnection of circuit wiring levels without contacting conductive planes.

Still another object of the invention is to provide a wiring scheme with a high performance and low resistivity. In addition, an aspect of the structure of the present invention permits high density wiring and reduction in chip interconnection to produce a high-function chip that has capability to have an entire microprocessor, a multi-function device, or more, built on it.

Also, an object of this invention is to provide an apparatus which is particularly suitable for ensuring the integrity of high frequency signals, even when voltage levels of signals decrease. Another object of the invention is to provide a structure wherein the integrity of the signals is maintained even when there is reduction in the energy operating level of the device.

Yet another object of the present invention is to provide a built-in alignment scheme and a high manufacturing yield. Still another object of this invention is to provide an additional embodiment within the scope of this invention that includes a transferring conduction option.

The foregoing and other aspects of the present invention will become apparent from the following detailed description of the invention when considered in conjunction with the accompanying drawing.

DETAILED DESCRIPTION OF THE INVENTION

A device and alignment structure, specifically, a semiconductor logic chip structure, having embedded power and ground planes between metal levels in the device architecture with a built-in alignment scheme is disclosed. In the following detailed description, numerous details are set forth. It will be clear to one skilled in the art, however, that the invention may be practiced without the specific details disclosed in this specification.

Figure 2A:
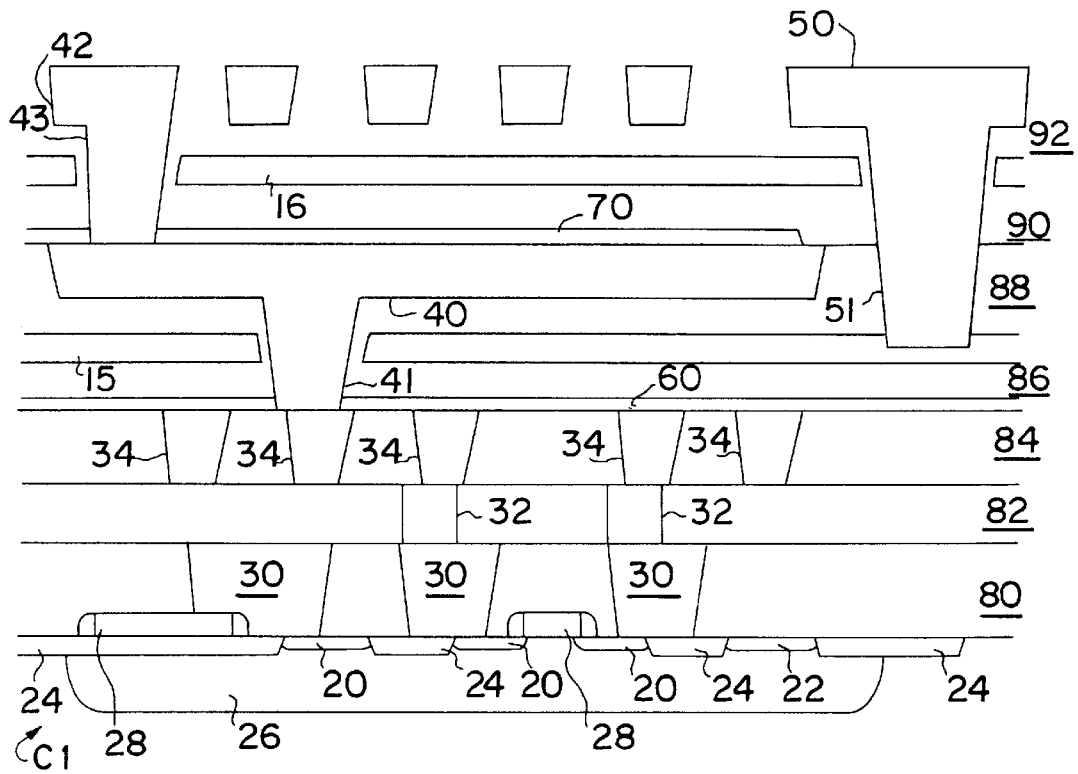
FIG. 2a shows an exemplary embodiment of a device architecture in accordance with the present invention.

Shown in FIG. 2a is a cross sectional view of a circuit apparatus according to the present invention. Chip 10 includes underlying transistor circuit C1. The chip may be a semiconductor substrate of, for example, single crystal silicon or gallium arsenide. Connected to the underlying circuit are metal contacts 30. An insulator 80 is placed in this layer also to ensure connections are only obtained at the appropriate circuit locations. Insulator 80 may be an oxide. Metal contacts 32 connect to metal contacts 30. An insulator 82 is also placed in the same layer as metal contacts 32 to ensure contact is obtained only at the appropriate contact locations. A third layer includes a conductor metal level 34, which may be at a potential equal to a logic level, and an insulator 84 isolating individual potential levels.

The conductor metal level 34 may be copper. Using a copper pattern (a wiring and via pattern), for example, reduces noise loss associated with wiring resistance in a device architecture. Copper as a conductor is an exceptional choice because of its low resistivity. The damascene copper process includes copper because copper is a better conductor (lower resistance) than previously used aluminum. Thus, the resistance of wiring levels decreases and noise is reduced. Copper is difficult, however, to etch. Thus, the copper is not etched. Rather, other areas of the device are etched and filled in with copper. The copper is then polished off leaving it only in the grooves thus providing a low resistance, high yielding conductive layer.

Insulator 84 in this third layer is used to ensure that only the appropriate circuit connections are obtained. Next a mask 60 of nitride, for example, may be used to act as an endpoint layer so that vias are not etched down the edge of the metal lines when overetched. Next, a partial layer of insulator 86 is used to ensure that only appropriate circuit connections are obtained. A planar conductive plane 15, set at a voltage equal to ground, for example, is above metal level 34. The conductive plane 15 is below an insulator 88. Next, a partial layer, above conductive plane 15, of a metal level 40 is used in the circuit for carrying signals.

Note that the conductive plane 15 does not contact the metal level 40 or via 41. An insulator 110 (shown in FIG. 6b) may be inserted between the conductive plane 15 and the metal level 40 and via 41 to ensure metal level 40 and via 41 and the conductive plane 15 do not contact one another. Metal level 40 is connected to conductive metal level 34 where necessary by via 41 for appropriate circuit connections. Next, a mask 70 of nitride, for example, may be placed where desirable on the metal level 40. A partial layer of insulator may be placed between the metal level 40 and a second planar conductive plane 16, a conductive power plane, for example.

A double damascene ground or power contact may be made to the first conductive plane 15 by pass through via 51. This double damascene contact may also be connected to a metal level 50 which is separated from the second conductive plane 16 by an insulator 90. A continuation of a metal layer 42 is connected to mask 70 through a via 43 formed in conductive plane 16. Although FIG. 2a shows only a few metal levels, there can be many more metal levels with appropriate insulators and conductive planes. For example, there may be six metal levels. In addition, there may be as many interconnections in the device architecture as desirable.

The architecture described above provides noise suppression in at least two ways. First, the planar conductive power and ground planes are separated by an insulator which makes a capacitor over the entire chip (where metal level 40 and via 41 are not) without sacrificing density, and these conductive planes act as shields to prevent capacitance coupling between wiring planes. Thus, the structure provides a decoupling capacitor with integrated planar conductive planes. The conductive planes are integrated into the circuit structure and located such that the conductive planes do not detract from device space. Thus, many functions may still be performed in the same space or less space as prior art circuitry with a higher performance rate of integrity of signals.

In addition, the planar conductive power and ground planes shield signals, functioning like a coaxial cable so that a signal may not "talk" to another signal above or below it in the circuit. Thus, the structure provides high performance signal integrity even when signal voltage levels or operating voltage levels are reduced. Furthermore, because the conductive planes are planar, there is less coupled noise in the circuit and higher manufacturing yield. For example, parasitic fringe capacitance is reduced. In addition, the present invention provides high yield because the conductors are planar and do not include the defects associated with side wall interfaces. If desirable, the conductor, copper for example, may be polished to increase yield.

As noise is reduced in the circuit structure, the circuit structure facilitates increased wiring and circuit density. Thus, the circuit can operate at a higher frequency, in the ranges of megahertz or gigahertz, for example, with increased density. In addition, as circuit and wiring density is increased, a single chip may perform more functions than previous single chips. A single chip is desirable because a single chip is more powerful than many interconnected chips. Thus, a single high function chip that has the capability to have an entire microprocessor or more, built within it, may be produced.

Figure 2B:
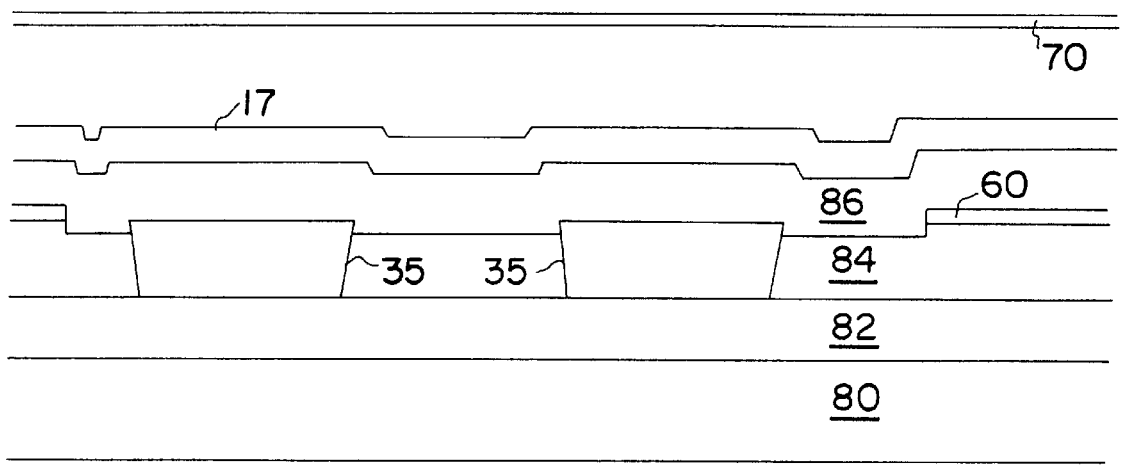
FIG. 2b shows an exemplary stage of the alignment architecture in accordance with the present invention.

Another feature of the present invention is the alignment architecture shown in an exemplary embodiment in FIG. 2b. Although the alignment architecture is shown in the scribe area (i.e., where the substrate will be diced or cut), alignment architecture may be in either the device area or the scribe area. For this example, the alignment architecture is located in the scribe area of the substrate. The alignment region A10 corresponds to chip 10. There are insulators 80, 82, and 84. In the same layer as insulator 84, there are stepped alignment marks 35 in the form of a metal plate. Above the insulator 84 is a mask 60. Above the alignment marks 35 and the mask 60, there is an insulator 86. Above insulator 86 is a stepped conductor 17. The stepped conductor 17 is not planar like conductive planes 15 and 16. In some circumstances, the conductor(s) may be reflective. Thus, the stepped alignment marks 35 and the stepped alignment conductor 17 are provided so that dark or bright field microscopy alignment may be performed.

To obtain the above structure, an exemplary building process is discussed below. Known processing steps and device structures have not been discussed in detail to avoid unnecessarily obscuring the invention. This is not to say that the steps not discussed are all in the prior art; rather, it is meant to note that the structure or step may otherwise be required during the process. For example, there are various techniques known in the prior art for depositing copper such as sputtering copper or electroplating copper.

Figure 3A:
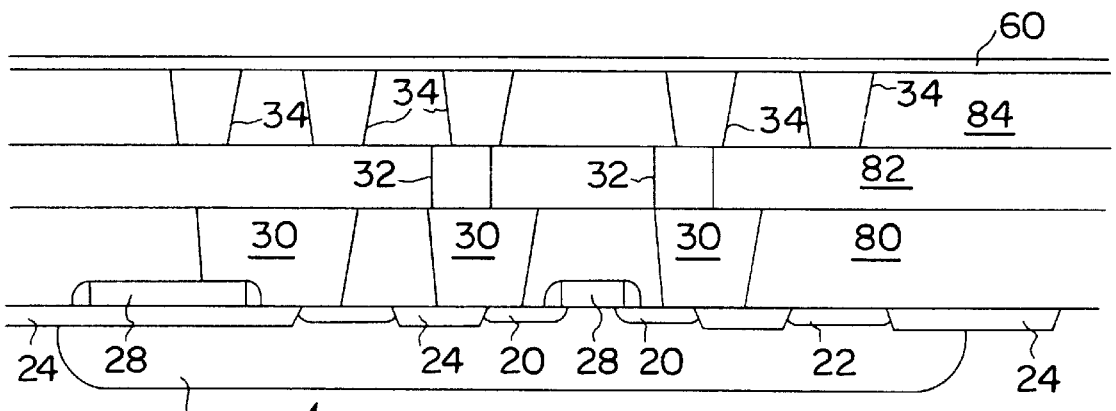
FIG. 3a shows a device architecture with features that the present invention incorporates.
Figure 3B:
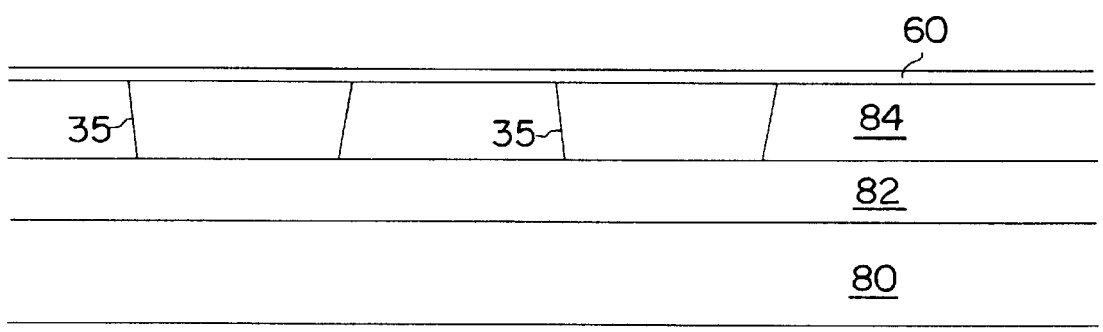
FIG. 3b shows an alignment architecture with features the present invention incorporates.

FIG. 3a and FIG. 3b show a device structure and an alignment structure, respectively, without planar conductive planes or stepped conductive plates. Metal level 34 and alignment marks 35 may be a damascene copper first metal level both with an adjacent insulator 84 and a silicon nitride mask 60.

Figure 4A:
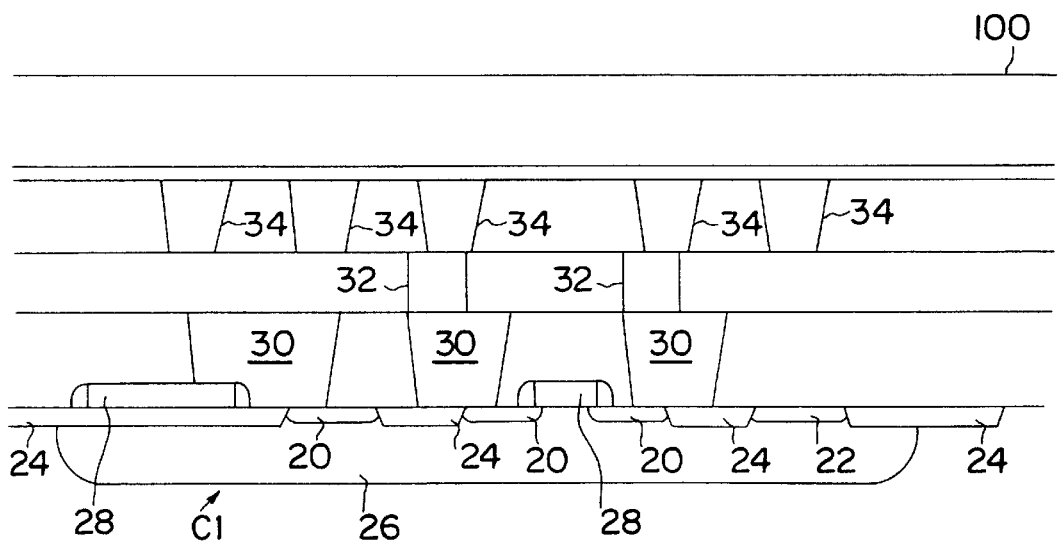
FIG. 4a shows an exemplary stage of the device architecture in accordance with the present invention.
Figure 4B:
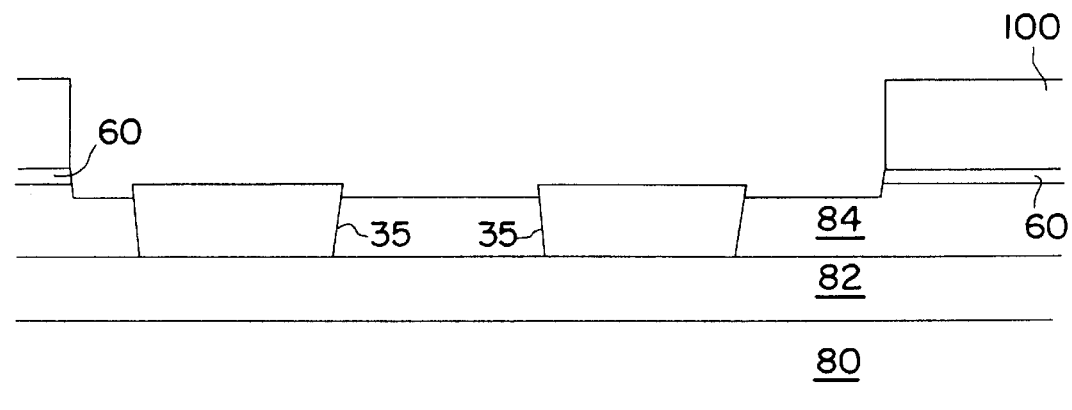
FIG. 4b shows an exemplary stage of the alignment architecture in accordance with the present invention.

A standard photo step is applied to the structures in FIGS. 3a and 3b. An adhesion promoter is applied, then a photoresist 100 is applied (FIG. 4a), a pattern is exposed on the photoresist, and then the photoresist is developed. Next, mask 60 and some of insulator 84 are etched. Etching mask 60 and part of insulator 84 defines steps in the stepped alignment mark 35. The resulting device and alignment structures are shown in FIGS. 4a and 4b, respectively. As is evident from FIG. 4b, an alignment mark has been defined with this etch.

The photoresist is then stripped from the device and alignment architectures. Next a mask of nitride, for example, is deposited on the device and alignment structures. An example of an advantage of this mask is that a nitride mask, for example, provides a moisture barrier to the copper conductor and prevents the copper from oxidizing. Next, an insulator 86, an oxide for example, is deposited. A conductor, a conductor plane 15 and stepped conductor 17 are deposited on insulator 86. In the device area, the conductor is a planar conductive plate, while in the alignment area, the conductor is a stepped plate. The conductor ideally would be a good conductor like copper, although copper is difficult to etch, so an aluminum-based conductor would be an alternative. If aluminum is used, an additional mask to make the alignment mark visible for a subsequent via and metal level may be desirable.

If the insulator 86 is recessed around the alignment mark(s) 35 after a mask etch, then a good dark field alignment mark could be formed if a reflective conductor is deposited on top of insulator 86. This added topography may lead to damascene metal patterns in the mask region, but that should not hinder the device. Another option would be to use a transparent conductor such as indium tin oxide that is used extensively in display and CCD Image Sensor Industry. Of course, use of a transparent conductor may eliminate a mask step.

Figure 5A:
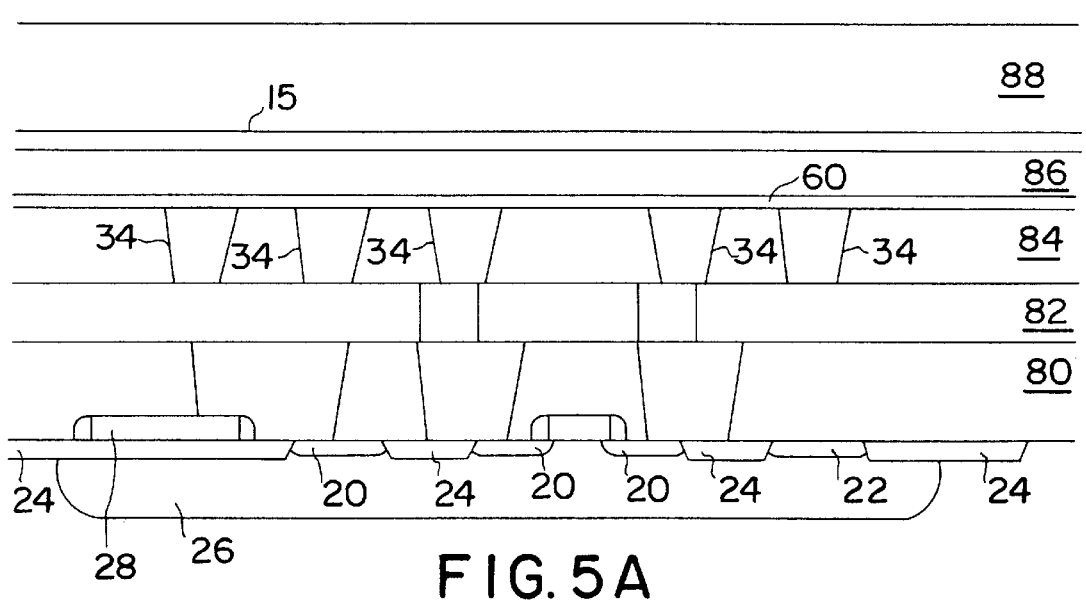
FIG. 5a shows an exemplary stage of the device architecture in accordance with the present invention.
Figure 5B:
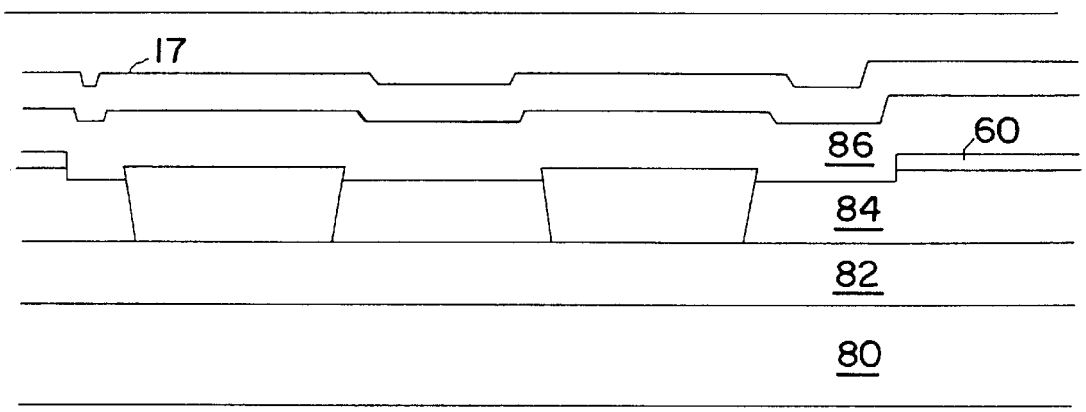
FIG. 5b shows an exemplary stage of the alignment architecture in accordance with the present invention.

An insulator 88, an oxide for example, is deposited on the conductor in both the device and alignment regions. The conductor may be polished where appropriate to remove topography. The resulting device structure and alignment structure are shown in FIG. 5a and FIG. 5b, respectively. Note that the alignment marks in FIG. 5b are replicated in the conductor plate. This reflective conductor plate then becomes an alignment structure for the metal level 40 and the via 41 to align them to the metal level 34 pattern.

Figure 7A:
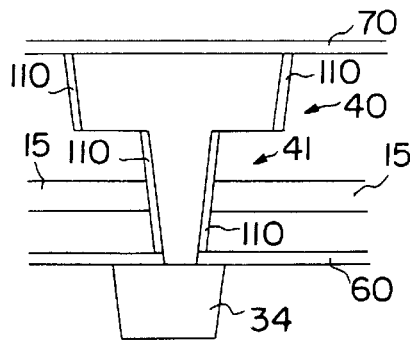
FIG. 7a shows an exploded view of a sidewall spacer.
Figure 7B:
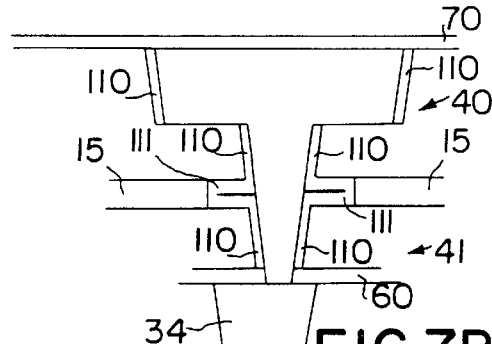
FIG. 7b shows an exploded view of a sidewall spacer with a recessed conductor.

Next, a standard photo step is applied to the structures in FIGS. 5a and 5b to define the metal level 40. An adhesion promoter is applied, then a photoresist is applied, a pattern is exposed on the photoresist, and then the photoresist is developed. Next, metal level 40 is etched. Then the metal level 40 photoresist is stripped. A standard photo step is applied to the existing structures for via 41 definition. Then, to define via 41, an adhesion promoter is applied, then a photoresist is applied, a pattern is exposed on the photoresist, and then the photoresist is developed. The via 41 is then etched. This includes etching insulator 86, conductive plane 15, and insulator 88, where desirable. The photoresist for the via 41 is then stripped. Next, mask 70 is deposited where desirable. The mask 70 is then etched. Sidewall spacers 110 may be incorporated into the device architecture (see FIG. 7a). The sidewall spacers of, for example, nitride are deposited and directionally etched. The sidewall spacers abut each of the sidewalls of the insulator 86-conductor 15-insulator 88 sandwich. Note that the isolation of vias from the conductive power planes by sidewall spacers integrates easily into the process, but attention should be given to its deposition. For example, the thickness of the isolation may add a bias to the metal lines and thus may reduce an achievable photo pitch. If the spacer is too thin, then there will be too much capacitive coupling with the vias.

Figure 6A:
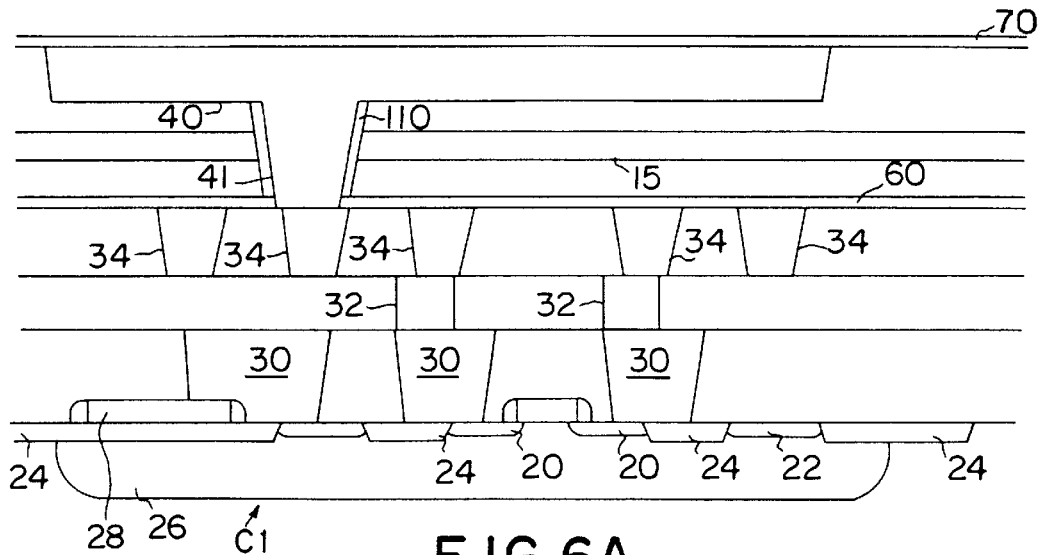
FIG. 6a shows an exemplary stage of the device architecture in accordance with the present invention.
Figure 6B:
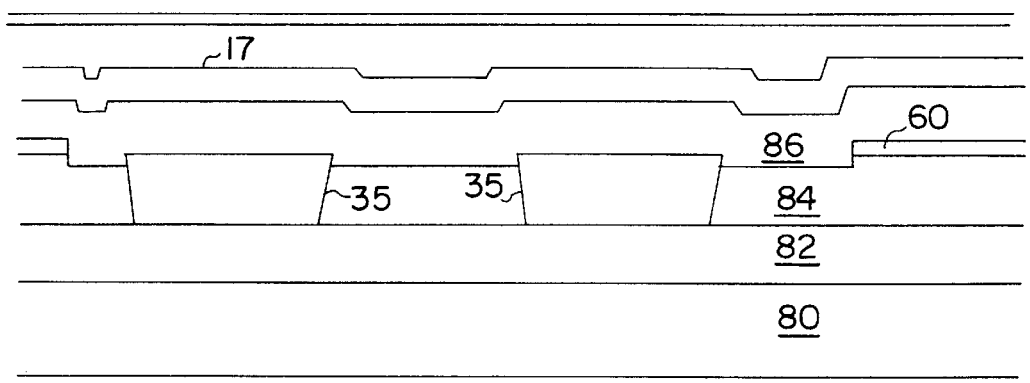
FIG. 6b shows an exemplary stage of the alignment architecture in accordance with the present invention.

The metal level 40 and via 41 are then deposited. The metal level 40 may be copper. If copper is deposited to form the metal level 40 and via 41, then the copper may be polished, stopping at mask 70. Thus, the conductor is polished where necessary to provide appropriate device contacts. The resulting device and alignment structures are shown in FIGS. 6a and 6b, respectively. As is evident from FIG. 6b, an alignment mark has been defined with the insulator 86-conductor 17-insulator 88 sandwich also.

Figure 1:
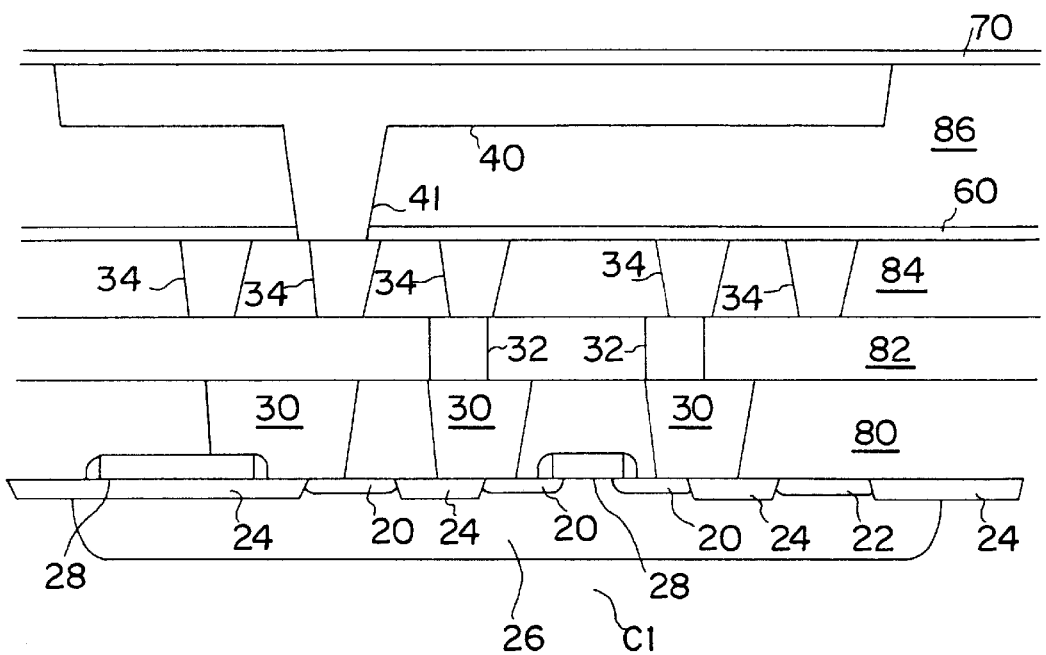
FIG. 1 shows a device with features that the present invention incorporates.

Next, the process for forming the metal level 40 and via 41 are basically repeated for the metal level 50 and via 51, and successive metal level(s) and via(s). There is a difference to the process discussed above. Now there may be a pattern in the masking level in FIG. 1 that opens up the device region allowing for the pass-through via 51 to reach the first planar conductor plane 15. A pattern may also be provided to allow alignment marks for metal levels to be visible at levels on top of them.

Alignment of the levels of the chip are a concern. Additional levels can build in alignment marks by doing a slight oxide recess etch, 100 nm for example, after the open step. This will pattern the metal and, when the conductive plane or plate is deposited over the insulator, it will replicate the step thus making a good dark field alignment mark from the previous metal level. This lack of planarity should not cause a problem even if it results in residual copper; the residual copper will just be in the ground plane contact areas and the alignment mark area.

A process option, a transferring conduction option, that reduces capacitive coupling with vias includes recessing the conductor after a via is etched in an insulator-conductor-insulator sandwich. Thus, an isotropic etch back would then be performed. The recess 111 is then filled, for example, with nitride. One reason this process is performed is to avoid recursive profiles before copper deposition. Another reason this process is performed is to allow imaging through the conductor recess.

Although preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed:

1. An apparatus comprising:
    a first conductive plane;
    a second conductive plane;
    a signal plane disposed between the first and second conductive planes; and
    a logic level disposed adjacent the first conductive plane and connected to the signal plane through at least one via in the first conductive plane.

2. The apparatus of claim 1, wherein the first conductive plane is a ground plane.

3. The apparatus of claim 1, wherein the second conductive plane is a power plane.

4. The apparatus of claim 1, further comprising at least one insulator layer.

5. The apparatus of claim 1, further comprising at least one insulator layer between the first conductive plane and the second conductive plane.

6. The apparatus of claim 1, wherein at least one conductive plane is copper.

7. The apparatus of claim 1, wherein at least one conductive plane is partially aluminum.

8. The apparatus of claim 1, wherein the first conductive plane is stepped.

9. The apparatus of claim 1, further comprising a stepped alignment plate.

10. A semiconductor architecture, comprising:
    a first conductive plane;
    a second conductive plane;
    a signal plane disposed between the first and second conductive planes;
    a logic level disposed adjacent the first conductive plane and connected to the signal plane through at least one via in the first conductive plane.

11. The semiconductor architecture of claim 10, wherein the first conductive plane is a ground plane.

12. The semiconductor architecture 10, wherein the second conductive plane is a power plane.

13. The semiconductor architecture of claim 10, further comprising at least one insulator layer.

14. The semiconductor architecture claim 10, further comprising at least one insulator layer between the first conductive plane and the second conductive plane.

15. The semiconductor architecture of claim 10, wherein at least one conductive plane is copper.

16. The semiconductor architecture of claim 10, wherein at least one conductive plane is partially aluminum.

17. The semiconductor architecture of claim 10, further comprising a stepped alignment plate.

18. The semiconductor architecture of claim 10, wherein the first conductive plane is stepped.

* * * * *